United States Patent
Yoon et al.

(10) Patent No.: US 9,722,155 B2
(45) Date of Patent: Aug. 1, 2017

(54) LED LIGHT SOURCE PACKAGE

(71) Applicant: Samsung Display Co., Ltd., Yongin-Si, Gyeonggi-Do (KR)

(72) Inventors: Byung Seo Yoon, Hwaseong-si (KR); Seong Yong Hwang, Asan-si (KR); Kyung Min Kim, Hwaseong-si (KR); Young Min Park, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/181,017

(22) Filed: Jun. 13, 2016

(65) Prior Publication Data

US 2016/0293814 A1    Oct. 6, 2016

Related U.S. Application Data

(62) Division of application No. 14/296,188, filed on Jun. 4, 2014, now Pat. No. 9,379,297.

(30) Foreign Application Priority Data

Feb. 6, 2014   (KR) .................. 10-2014-0013715

(51) Int. Cl.
| | |
|---|---|
| H01L 29/06 | (2006.01) |
| H01L 31/072 | (2012.01) |
| H01L 33/58 | (2010.01) |
| G02B 3/00 | (2006.01) |

(52) U.S. Cl.
CPC ............... *H01L 33/58* (2013.01); *G02B 3/00* (2013.01)

(58) Field of Classification Search
CPC ...................... H01L 2924/12041; H01L 33/24

USPC ....................... 257/13, 79; 438/22
See application file for complete search history.

(56) References Cited

U.S. PATENT DOCUMENTS

| | | | |
|---|---|---|---|
| 7,474,474 B2 * | 1/2009 | Angelini | .................. F21K 9/00 |
| | | | 257/98 |
| 8,182,110 B2 | 5/2012 | Jiang et al. | |
| 2002/0170660 A1 | 11/2002 | Hashimoto | |
| 2013/0049049 A1 | 2/2013 | Choi | |
| 2013/0223072 A1 | 8/2013 | Castillo | |
| 2013/0223081 A1 | 8/2013 | Jiang et al. | |

FOREIGN PATENT DOCUMENTS

| | | |
|---|---|---|
| KR | 1020060035042 A | 4/2006 |
| KR | 100593933 B1 | 6/2006 |
| KR | 1020060112071 A | 10/2006 |
| KR | 1020060112113 A | 10/2006 |
| KR | 1020070021873 A | 2/2007 |
| KR | 1020070021874 A | 2/2007 |
| KR | 100808669 B1 | 2/2008 |
| KR | 1020080038669 A | 5/2008 |
| KR | 1020130041571 A | 4/2013 |
| KR | 1020130062222 A | 6/2013 |

* cited by examiner

*Primary Examiner* — Theresa T Doan
(74) *Attorney, Agent, or Firm* — Innovation Counsel LLP

(57) ABSTRACT

Provided is a LED light source package comprising a circuit board, a light source seated on an upper portion of the circuit board, and a lens structure arranged on the upper portion of the circuit board via the light source. A surface that faces the light source in the lens structure includes a first inclined surface that projects toward the light source as going to a center portion of the lens structure.

4 Claims, 18 Drawing Sheets

LED LIGHT SOURCE PACKAGE

CROSS-REFERENCE TO RELATED APPLICATIONS

This application is a divisional application of U.S. patent application Ser. No. 14/296,188 filed on Jun. 4, 2014, which claims priority to and the benefit of Korean Patent Application No. 10-2014-0013715 filed on Feb. 6, 2014 in the Korean Intellectual Property Office, the disclosure of which is incorporated herein in its entirety by reference.

BACKGROUND

1. Field

The present application relates to an LED light source package.

2. Description of the Prior Art

A liquid crystal display is given much weight in the information display technology. The liquid crystal display displays information in a manner that liquid crystals, which are inserted between two glass substrates, emit light through application of a power to electrodes positioned on upper and lower portions of the glass substrates.

The liquid crystal display is a light receiving device which is not self-luminous and thus displays an image through adjustment of permeability of light that is input from outside, and thus requires a separate device for irradiating a liquid crystal panel with light, that is, a backlight unit.

Recently, a light emitting diode (LED) has been spotlighted as a light source of a backlight unit of a liquid crystal display. The LED is a semiconductor light emitting element that emits light when current flows through the LED. Since the LED has the advantages of long lifespan, low power consumption, rapid response speed, and superior initial driving characteristics, it has been widely used as an illumination device, a billboard, and a backlight unit of a display device, and its application fields have been gradually extended.

According to an LED light source, an LED package, in which an LED chip is positioned in a mold frame, is arranged on a circuit board, or an LED chip, which is coated with a phosphor layer, is mounted on a circuit board.

SUMMARY

One embodiment provides an LED light source package, which can prevent light leakage that may occur between lens legs connecting a lens structure and a circuit board to each other.

Another embodiment provides an LED light source package, which can prevent light leakage that may occur due to ejector pin marks formed on a lens structure.

Still another embodiment provides an LED light source package, which can prevent whirling that may occur due to a round surface of a lower corner of a lens structure.

Additional features of the inventive concept will be set forth in part in the description which follows and in part will become apparent to those having ordinary skill the art upon examination of the following or may be learned from practice of the inventive concept.

In one embodiment, there is provided an LED light source package comprising a circuit board, a light source seated on an upper portion of the circuit board, and a lens structure arranged on the upper portion of the circuit board via the light source. A surface that faces the light source in the lens structure includes a first, inclined surface that projects toward the light source as going to a center portion of the lens structure.

The light source comprises an LED chip, and the LED chip may be mounted on the circuit board.

A plane on which a light emitting surface of the light source may be positioned cuts the first inclined surface.

The plane may cut the first inclined surface into an exterior portion above the plane, and a center portion below the plane.

The lens structure may further comprise a projecting column that projects toward the circuit board, and the projecting column is on the first inclined surface.

A plurality of projecting columns may be on the first inclined surface to be spaced apart from each other.

An end surface of the projecting column may have a same inclination as the first inclined surface.

The LED light source package may further comprise an intaglio groove in the projecting column.

The intaglio groove may have a thickness that is smaller than a thickness of the projecting column based on the first inclined surface of the lens structure.

The LED light source package may further comprise a plurality of lens legs to join the lens structure and the circuit board together, wherein the plurality of lens legs are on the first inclined surface.

In the lens legs, a distance value D in Equation 1 below may be 0.05 to 0.15 mm, $$D = \text{Gap1} - \text{Gap2} \qquad (1)$$

where, Gap1 denotes a gap of the lens legs between the circuit board and the lens structure on the side that is far from the light source, and Gap2 denotes a gap of the lens legs between the circuit board and the lens structure on the side that is near to the light source.

The lens structure may further comprise a second inclined surface having an inclination angle that is different from an inclination angle of the first inclined surface.

The second inclined surface may have an inclination that is lower than an inclination of the first inclined surface.

The second inclined surface may have an inclination that is opposite to an inclination of the first inclined surface.

The LED light source package may further comprise a projecting column that is on the second inclined surface to project toward the circuit board.

The LED light source package may further comprise a plurality of lens legs to of join the lens structure and the circuit board together, wherein the plurality of lens legs are on the second inclined surface.

The lens structure may further comprise a projecting column that projects toward the circuit board, and the projecting column is on the second inclined surface.

In another embodiment, there is provided an LED light source package comprising a circuit board, a light source mounted on the circuit board, and a lens structure arranged on an upper portion of the circuit board via the light source, wherein a gap measured from the circuit board to a surface that is adjacent to the circuit board of the lens structure becomes larger as going far apart from the light source.

The LED light source package may further comprise a plurality of lens legs to join the lens structure and the circuit board together, wherein the plurality of lens legs are on an outer portion of the surface that is adjacent to the circuit board of the lens structure.

The lens structure may further comprise a projecting column that projects toward the circuit board, and the projecting column is on the surface that is adjacent to the circuit board.

According to aspects of the inventive concept, the light leakage that may occur through a space between the lens legs installed between the lens structure and the circuit board can be prevented from occurring, and the light leakage that may occur due to the ejector pin marks can be prevented from occurring. Further, the whirling that may occur due to the round surface of the lower corner of the lens structure can be prevented from occurring.

Other features and aspects will be apparent from the following detailed description, the drawings, and the claims.

BRIEF DESCRIPTION OF THE DRAWINGS

The above and other features of the inventive concept will be more apparent from the following, detailed description taken in conjunction with the accompanying drawings, in which.

DETAILED DESCRIPTION OF THE EMBODIMENTS

Figure 1:
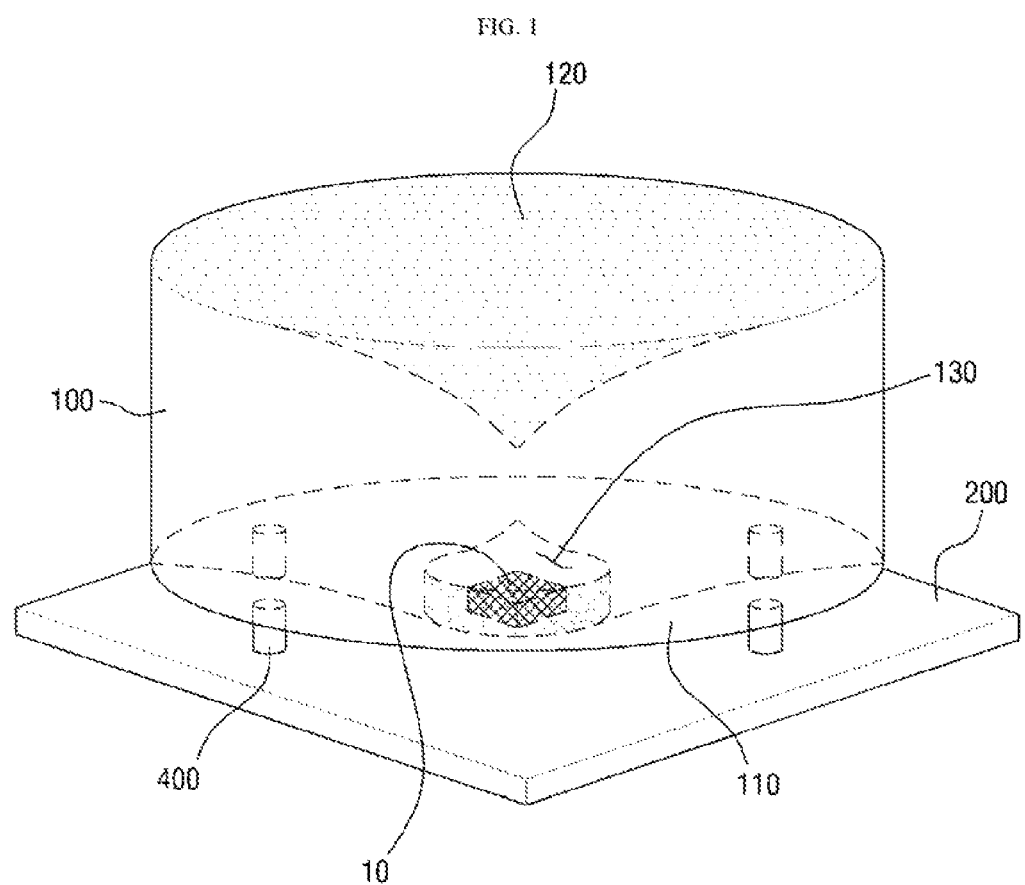
FIG. 1 is a perspective view of an LED light source package according to an embodiment.

Aspects and features of the inventive concept and methods for achieving the aspects and features will be apparent by referring, to the embodiments to be described in detail with reference to the accompanying drawings. However, the inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concept, and the inventive concept is only defined within the scope of the appended claims.

The term "on" that is used to designate that an element is on another element or located on a different layer or a layer includes both a case where an element is located directly on another element or a layer and a case where an element is located on another element via another layer or still another element. In the entire description, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments will be described with reference to the accompanying drawings.

Figure 2:
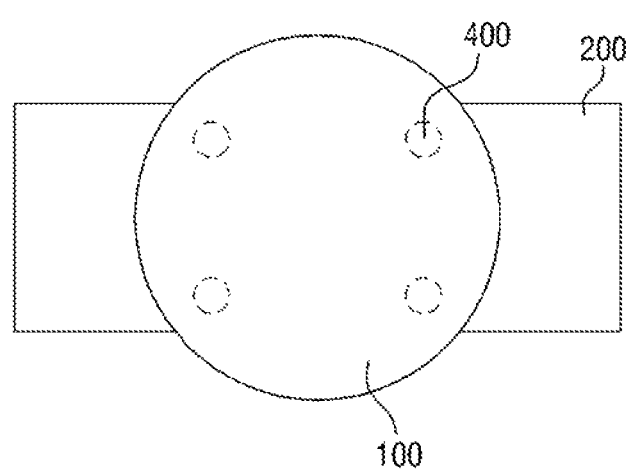
FIG. 2 is a plan view of the LED light source package of FIG. 1.
Figure 3:
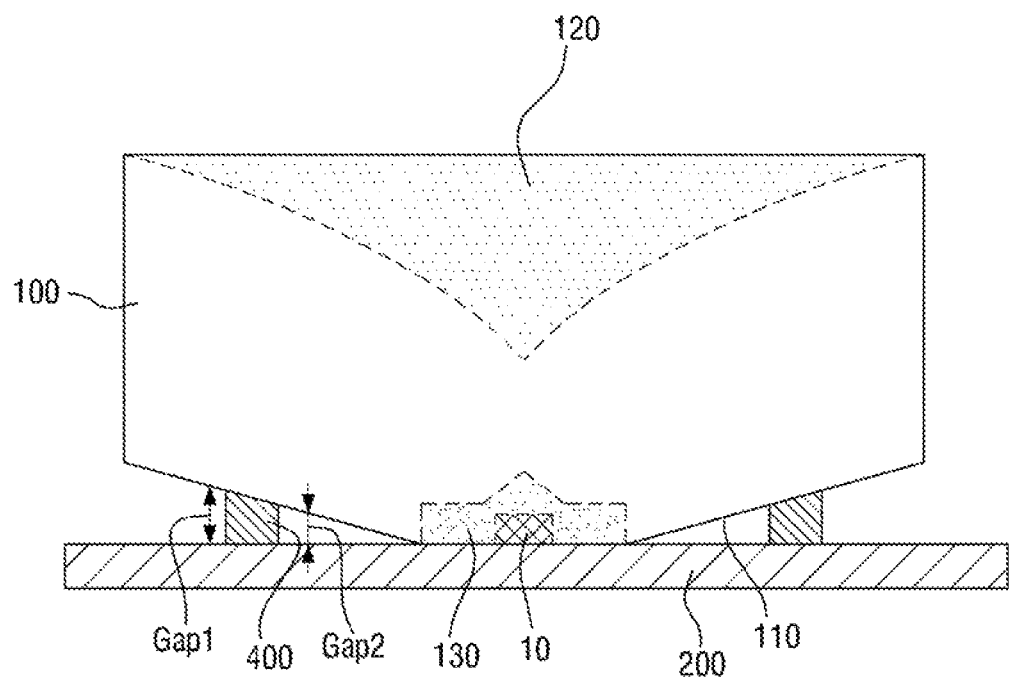
FIG. 3 is a cross-sectional view of the LED light source package of FIG. 1.

FIG. 1 is a perspective view of an LED light source package according to an embodiment, FIG. 2 is a plan view of the LED light source package of FIG. 1, and FIG. 3 is a cross-sectional view of the LED light source package of FIG. 1.

Referring to FIG. 1, FIG. 2 and FIG. 3, an LED light source package according to an embodiment may include a circuit board 200, a light source 10 seated on an upper portion of the circuit board 200, and a lens structure 100 arranged on the upper portion of the circuit board 200 via the light source 10. In the lens structure 100, a surface that faces the light source 10 may include a first inclined surface 110 that projects toward the light source 10 as going to a center portion of the lens structure 100.

The circuit board 200 may be a printed circuit board (PCB), and may be formed of an organic resin material including epoxy, triazine, silicon, and polyimide or other organic resin materials. Further, the circuit board 200 may be a flexible printed circuit board (FPCB) or a metal core printed circuit board (MCPCB).

Further, the circuit board 200 may include a circuit pattern to apply an electrical signal to the light source 10, and the circuit pattern may be formed of a metal material having superior electrical conductivity and thermal conductivity, for example, gold (Au), silver (Ag), or copper (Cu).

The light source 10 may include an LED chip, and an LED chip coated with phosphor may be mounted on the circuit board 200. The light source 10 may be mounted on the circuit board 200 by soldering or surface mounting technology (SMT). The circuit board 200 and the light source 10 may be electrically connected to each other to emit light according to an electrical signal applied from the circuit board 200. Further, the LED chip may be mounted on the circuit board 200 in a state where a separate mold frame is not arranged on a side surface of the LED chip.

The phosphor may include at least one of red phosphor, green phosphor, and yellow phosphor, and may include at least one of YAG, TAG, silicate, nitride, and oxynitride based materials, but is not limited thereto.

In the lens structure 100, the surface that faces the light source 10 may include the first inclined surface 110 that projects toward the light source 10 as going to the center portion of the lens structure 100. That is, the lens structure 100 may include a lower end portion that faces the circuit board 200 and an upper end portion that faces an opposite surface on which the circuit board 200 is formed, and the first inclined surface 110 may be formed to face the surface on which the circuit board 200 is formed.

On the center portion of the lens structure 100, the light source 10 that is mounted on the circuit board 200 may be arranged, and in the lens structure 100, a surface that faces the circuit board 200 may include the first inclined surface 110 that projects toward the light source 10 on the circuit board 200. That is, the first inclined surface 110 may be positioned between the lens structure 100 of the light source 10 and the circuit board 200, and may be positioned in the center portion of the lens structure 100 on a plane. Accordingly, the first inclined surface 110 may be formed on the surface that faces the light source of the lens structure 100, and may be formed to project as going to the place where the light source 10 is arranged.

In other words, the LED light source package according to the present embodiment may include the circuit board 200, the light source 10 mounted on the circuit board 200, and the lens structure 100 arranged on the upper portion of the light source 10 and arranged on the circuit hoard 200 via the light source 10. A gap measured from the circuit board 200 to the surface adjacent to the circuit board 200 of the lens structure 100 may be increased as getting far apart from the light source 10. In this case, the surface that is adjacent to the circuit board 200 of the lens structure 100 may be the first inclined surface 110 as described above. Stated another way, in one embodiment, the gap between the first inclined surface 110 and the circuit board 200 increases as the horizontal distance from the light source 10 increases.

Further, a light emitting surface (the horizontal upper surface of the light source 10 in the view of FIG. 3) of the light source 10 defines a plane. The plane may cut the first inclined surface 110. More particularly, the plane may cut the first inclined surface 110 into an exterior portion above the plane and a center portion below the plane. That is, the plane on which the light emitting surface of the light source 10 may be positioned on a middle point of the first inclined surface 110, and based on the plane on which the light emitting surface is positioned, an exterior portion of the first inclined surface 110 may be positioned on an upper side than the light emitting surface, and a center portion of the first inclined surface 110 may be positioned on a lower side than the light emitting surface.

On the other hand, an inclination angle of the first inclined surface 110 of the lens structure 100 according to the present embodiment may be larger than 0° and equal to or smaller than 15°, relative to the circuit board. 200, but is not limited thereto. Specifically, the inclination angle means the degree of inclination as going from the edge to the center portion of the lens structure 100, and means the degree of inclination to the center portion of the lens structure with respect to a case where the lower end portion of the lens structure has a shape to be arranged in parallel to the printed circuit board.

Further, the LED light source package may further include a plurality of lens legs 400 for joining the lens structure 100 and the circuit board 200 together, and the plurality of lens legs 400 may be formed on the outer portion of the surface that is adjacent to the circuit board 200 of the lens structure 100.

The upper end portion 120 of the lens structure 100 may be of a side emitting type in which the upper end portion 120 extends upward with art inclination from a vertical center axis of the lens structure 100, but is not limited thereto. The shape of the upper end portion 120 of the lens structure 100 may be appropriately modified by those having ordinary skill in the art to which the inventive concept pertains.

The LED light source package may further include the plurality of lens legs 400 for joining the lens structure 100 and the circuit board 200 together, and the lens legs 400 may be formed on the first inclined surface 110. The lens legs 400 are to join the lens structure 100 to the circuit board 200, and may be arranged on the outer portion of the first inclined surface 110. That is, in the lens structure 100, the light source 10 may be arranged on the center portion of the lower end portion which is the surface that is adjacent to the circuit board 200, and the lens legs 400 may be formed on the outer portion of the first inclined surface 110 of the lower end portion. Accordingly, the lens structure 100 may be joined to the circuit board by the lens legs 400 to be supported on the circuit board 200.

In the lens structure 100, the surface that faces the light source 10 includes the first inclined surface 110 that projects toward the light source as going toward the center portion of the lens structure 100. The distance between the lens structure 100 and the circuit board 200 may be shortened as going toward the portion where the light source 10 is positioned. Accordingly, at the portion where the light source is positioned, the gap between the lens structure 100 and the circuit board 200 may be shortened, while at the outer portion, the gap may be lengthened. As a result, light that is emitted from the light source 10 can be prevented from leaking to a space between the lens structure 100 and the circuit hoard 200, and a space in which the lens legs 400 are formed can be provided in the outer portion of the lens structure 100.

If the gap between the circuit board 200 and the lens structure 100 is narrow at a position where the lens legs 400 are fumed, adhesives that are used on the lens legs 400 may reach even the lower end portion of the lens structure 100 to cause a problem that the optical characteristics of the light that is emitted from the LED light source package are not uniform. Further, if the amount of adhesives is reduced to avoid this problem, the adhesive property of the lens structure 100 and the circuit board 200 may be weakened to cause a problem that the endurance of the LED light source package is totally weakened.

More specifically, in order to join the lens structure 100 and the circuit board 200 together in a preferable adhesive state, it is necessary to provide a constant gap in which the lens legs 400 are formed between the tens structure 100 and the circuit board 200. In the lens structure 100 according to the present embodiment, the first inclined surface 110 that projects toward the light source 10 is included on the lower end portion of the lens structure 100, and thus the constant gap in which the lens legs 400 can be formed is provided on the outer portion of the lens structure 100. Accordingly, the lens structure 100 and the circuit board 200 can be adhered to each other through the lens legs 400.

Next, in order to prevent the light emitted from the light source 10 from leaking to the gap between the circuit board 200 and the lens structure 100, it is advantageous that the gap between the lens structure 100 and the circuit board 200 becomes smaller in the center portion that is the position of the lens structure 100 adjacent to the light source 10. Since the lens structure 100 according to the present embodiment includes the first inclined surface 110 so that the center portion of the lower end portion of the lens structure 100 projects toward the circuit board 200, the gap between the lens structure 100 and the circuit board 200 can be reduced in the vicinity of the light source 10. Accordingly, the light leakage can be prevented from occurring.

According to the lens legs 400, a distance value D in Equation 1 below may be, for example, 0.05 to 0.15 mm.

$$D = \mathrm{Gap1} - \mathrm{Gap2} \qquad (1)$$

The term "Gap1" denotes a gap of the lens leg between the circuit board and the lens structure on the side that is far from the light source, and "Gap2" denotes a gap of the lens leg between the circuit board and the lens structure on the side that is near to the light, source.

In other words, Gap1 means a length in which the lens leg 400 is formed on the side that is far from the light source, and Gap2 means a length in which the lens leg 400 is formed on the side that is near to the light source.

Since the lower end portion of the lens structure 100 is convex to the circuit board 200 as going to the side surface of the light source 10, the length of the lens leg 400 may be shortened as going toward the light source 10.

On the other hand, if the lower end portion of the lens structure has a horizontal structure, the light emitted from the light source may leak to the space between the lens structure and the circuit board. Further, if the space between the lens structure and the circuit board is made fine to reduce the space between the lens structure and the circuit board, the space in which the lens legs for joining the lens structure and the circuit board together are formed may become insufficient. Accordingly, if the lower end portion of the lens structure projects as going toward the portion where the light source is arranged, like the LED light source package according to the present embodiment, the space between the lens structure and the circuit board can be reduced to prevent the light leakage in the portion where the light source is positioned, and the space for forming the lens legs can be secured in the outer portion.

In the center of the lower end portion of the lens structure 100, a groove 130 that is a radial empty space may be formed toward the inside of the lens structure 100. The position of the groove 130 on the lens structure 100 may be a portion that corresponds to the portion where the light source 10 is positioned, and the light source 10 that is mounted on the circuit board 200 may be inserted into the empty space of the groove 130. On the other hand, since the empty space that forms the groove 130 is formed in a radial shape, the light that is incident from the light source 10 can be uniformly spread to the inside of the lens structure 100 to be emitted.

In other words, since the lens structure 100 includes the groove 130 that is formed in the position that corresponds to the light source 10, the lens structure 100 can be seated on the upper portion of the circuit hoard 200 to surround the light source that is mounted on the circuit board 200.

However, the shape of the groove 130 as described above is not limited to the radial shape, but may be appropriately modified to various shapes by those having ordinary skill in the art according to circumstances. In the description, the detailed explanation thereof will be omitted.

Figure 4:
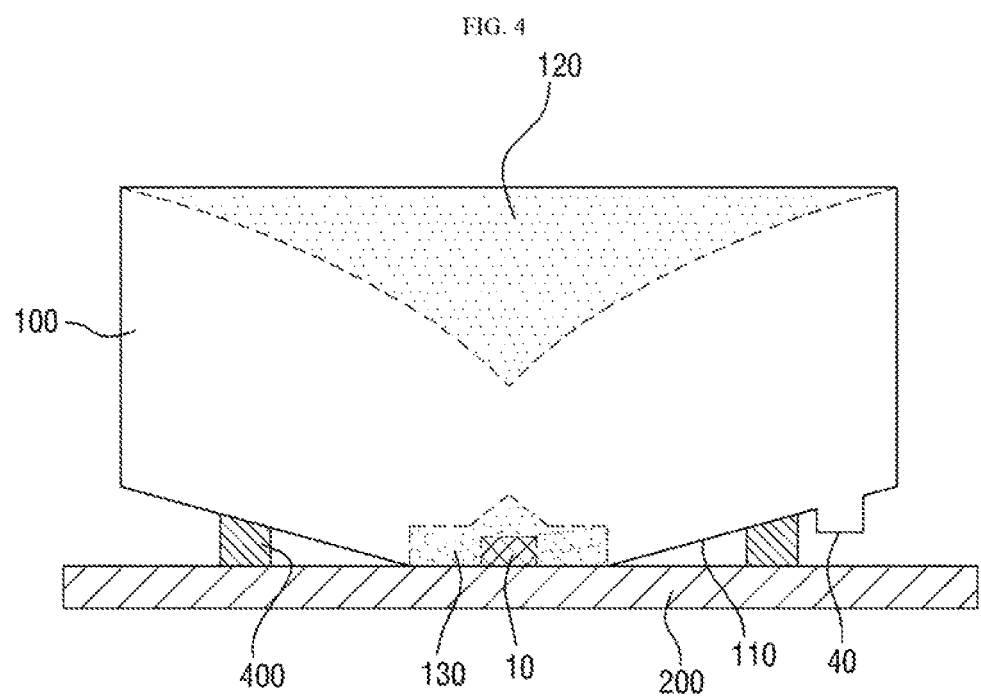
FIG. 4 is a cross-sectional view of an LED light source package according to another embodiment.

On the other hand, FIG. 4 illustrates an LED light source package according to another embodiment. As illustrated in FIG. 4, the lens structure 100 may further include a projecting column 40 that projects toward the circuit board 200, and the projecting column 40 may be formed on the first inclined surface 110. Further, a plurality of projecting columns 40 may be formed on the first inclined surface 110 to be spaced apart from each other, and may be formed on both side surfaces on the vertical cross-section of the lens structure 100.

The projecting columns 40 may be marks formed by eject pins that occur in the manufacturing process of the lens structure 100. That is, the lens structure 100 is formed in a mold in which intaglios are formed to correspond to the shape of the lens structure, and in an extracting process, the lens structure 100 is pushed by ejector pins to be extracted out of the mold. In this case, ejector pin marks may be formed on the lens structure 100.

If the elector pin marks form the intaglios in the lens structure 100, they may reflect the light that travels in the lens structure 100 or change the light path, and thus the light may be concentrated onto a specific position in the upper portion of the lens structure 100. Such light concentration may disturb the emission of the light from the lens structure 100 with uniform luminance distribution.

If the ejector pin marks are the projecting columns 40 that project out of the lens structure 100 as in the present embodiment, they do not exert an influence on the path of the light that travels in the lens structure 100, and thus the light can be emitted from the lens structure 100 with uniform luminance distribution. In order to prevent the intaglio ejector pin marks from being formed on the lens structure 100 and form the ejector pin marks in the shape of projecting columns 40, a groove may be formed on the portion on which the ejector pins of the mold for manufacturing the lens structure 100 are positioned. Accordingly, by forming the projecting columns 40 on the lens structure 100 itself and pushing the projecting columns 40 by means of the ejector pins to extract the lens structure 100, the ejector pin marks can be prevented from being formed in the lens structure 100.

Figure 5:
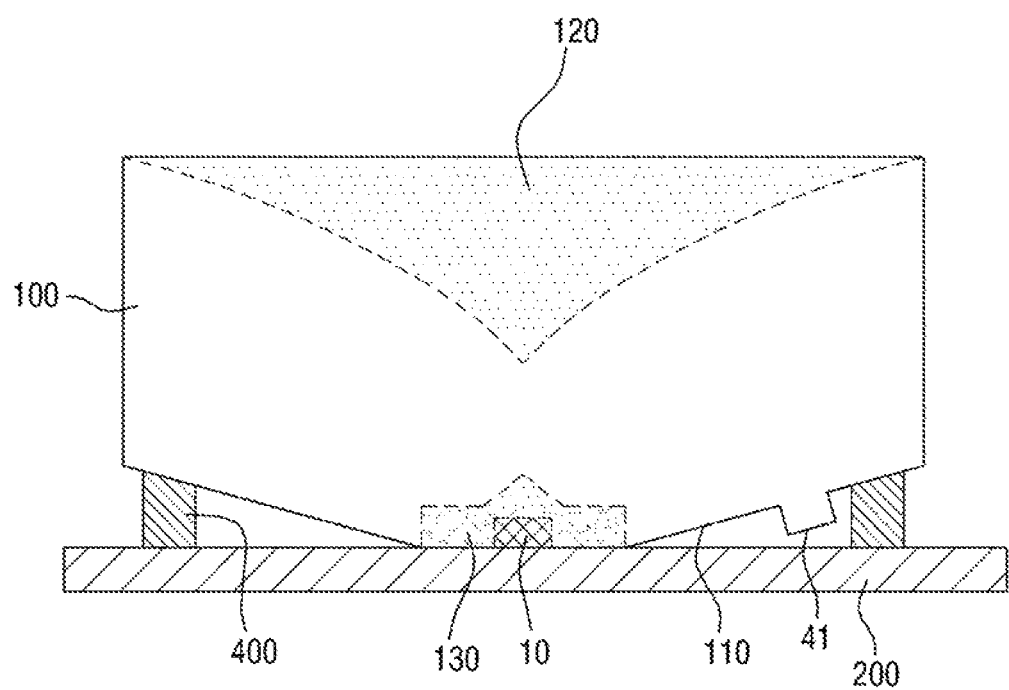
FIG. 5 is a cross-sectional view of an LED light source package according to still another embodiment.

As shown in FIG. 4, the projecting column 40 may be formed on an outer side outside the position where the lens leg 400 is formed, or as shown in FIG. 5, the projecting column 40 may be formed on an inner side inside the position where the lens leg 400 is formed.

Figure 6:
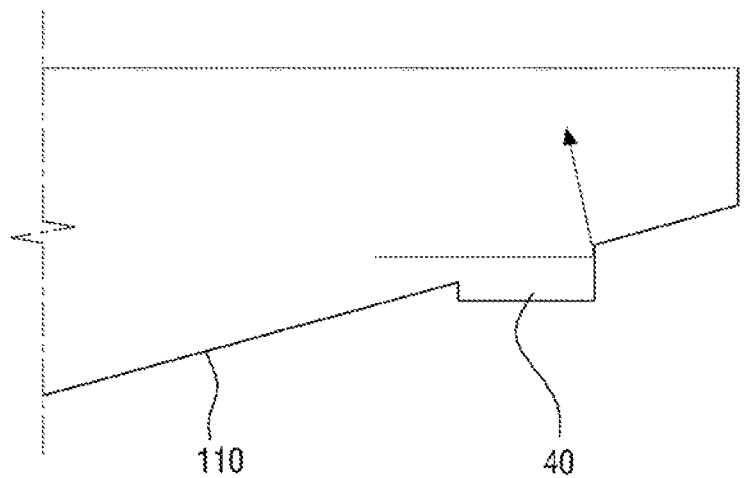
FIG. 6 is an enlarged cross-sectional view of a lens structure according to an embodiment.
Figure 7:
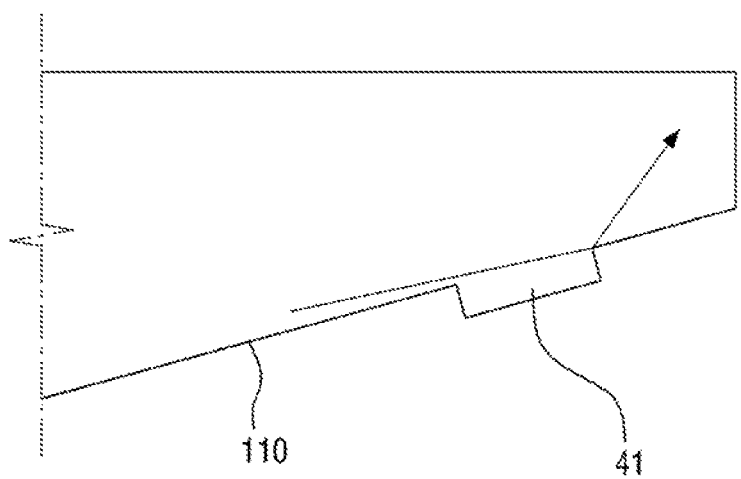
FIG. 7 is an enlarged cross-sectional view of a lens structure according to another embodiment.

As shown in FIG. 6, the projecting column 40 may be formed regardless of the inclination of the first inclined surface 110 of the lens structure 100, or as shown in FIG. 7, the projecting column 41 may be formed with the same inclination as the first inclined surface 110. That is, the end surface of the projecting column 41 may be formed in parallel to the first inclined surface 110. If the end surface of the projecting column 41 is formed as shown in FIG. 7, step height in the lens structure 100, which may occur due to the projecting column 41, can be reduced, and the reflection of the light that travels toward the step height occurring due to the projecting column 41 can be reduced. Accordingly, the light can be emitted from the lens structure 100 with uniform luminance distribution.

Figure 8:
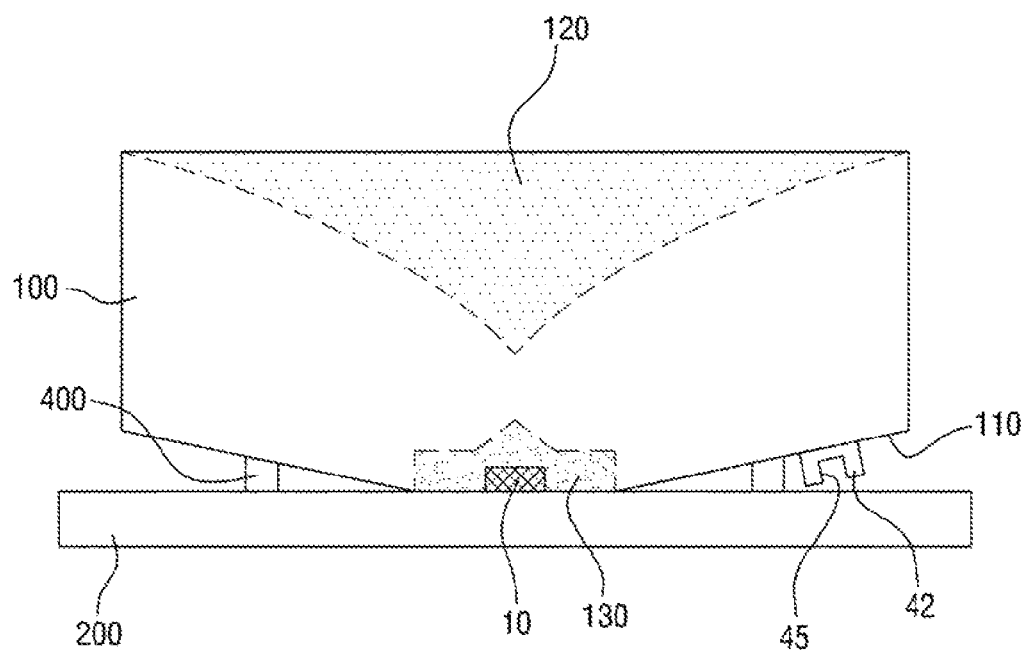
FIG. 8 is a cross-sectional view of an LED light source package according to still another embodiment.

Referring to FIG. 8, an intaglio groove 45 may be further included in the projecting column 42. The intaglio groove 45 may be formed by the ejector pins in the manufacturing process of the lens structure. As described above, by forming the groove on the portion where the ejector pin is positioned in the mold of the lens structure, the projecting column can be formed on the lens structure. In the ejector pin groove of the mold, the ejector pins may push the projecting column portions of the formed lens structure through upward/downward motion to extract the lens structure out of the mold. In this case, if the ejector pin having a size that is smaller than the size of the ejector pin groove is used, as shown in FIG. 8, the intaglio groove 45 may be formed in the projecting column 42 of the lens structure.

The intaglio groove 45 may be formed with a thickness that is smaller than the thickness of the projecting column 42 based on the first inclined surface 110 of the lens structure 100. If the intaglio groove 45 is formed with a thickness that is thicker than the thickness of the projecting column 42, the intaglio groove 45 is formed in the lens structure 100, and this may exert an influence on the path of the light that travels in the lens structure 100.

In the drawing, the cross section of the projecting column or the intaglio groove is in a straight line or rectangular shape, but is not limited thereto. The cross section of the projecting column or the intaglio groove may be in a curved or triangular shape, and various shapes may be included within the range that does not exert an influence on the light path in the lens structure.

Figure 9:
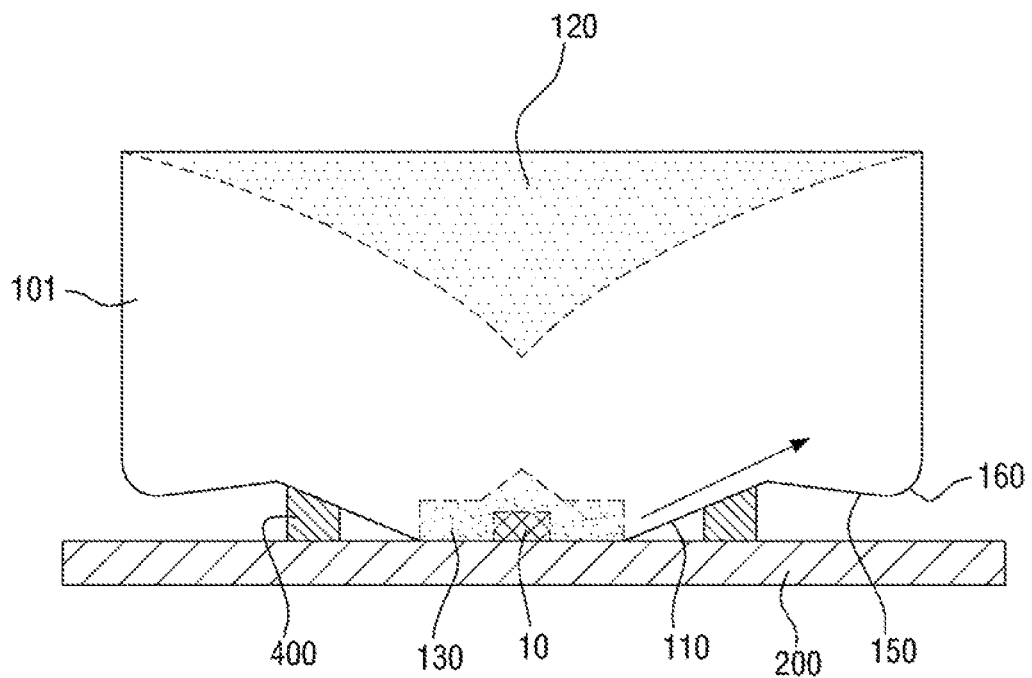
FIG. 9 is a cross-sectional view of an LED light source package according to still another embodiment.

FIG. 9 illustrates an LED light source package according to still another embodiment. As illustrated in FIG. 9, the lens structure 101 may further include a second inclined surface 150 having an inclination angle that is different from the inclination angle of the first inclined surface 110. The second inclined surface 150 may come in contact with the first inclined, surface 110 and may be positioned on the outer portion of the lens structure 101.

In the process of extracting the lens structure from the mold, although the corner of the lower end portion of the lens structure is intended to be processed completely at right angles, the corner surface of the lower end portion of the lens structure may not be processed completely at right angles, but may be processed as a round surface due to surface tension or other problems in the mold.

If the corner surface 160 of the lower end portion of the lens structure 101 is formed as a round surface, a kind of whirling that the luminance is concentrated, in a ring shape on the upper portion of the lens structure 101 may occur due to the light reflection on the round surface. The whirling is a phenomenon that light is concentrated onto a specific region, and this may disturb the light emission with uniform luminance distribution from the lens structure 101.

Figure 10:
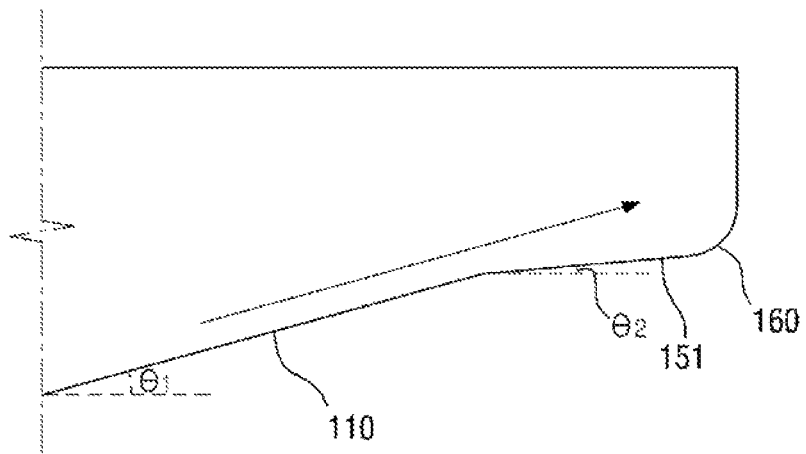
FIG. 10 and FIG. 11 are enlarged cross-sectional views of a lens structure according to still another embodiment.

Accordingly, by forming the second inclined surface 150 having the inclination that is different from the inclination of the first inclined surface 110 on the outer portion of the lens structure 101 on which the round surface may be formed, the corner surface can be prevented from being put on the main path of the light, and thus the whirling due to the round corner surface 160 can be prevented from occurring. Like the lens structure of FIG. 10, the second inclined surface 150 may have an inclination that is lower than the inclination of the first inclined surface 110. Referring to FIG. 10, if it is assumed that the inclination angle of the first inclined surface 110 is $\theta_1$ and the inclination angle of the second inclined surface 150 is $\theta_2$, $\theta_1$ may be larger than $\theta_2$.

Figure 11:
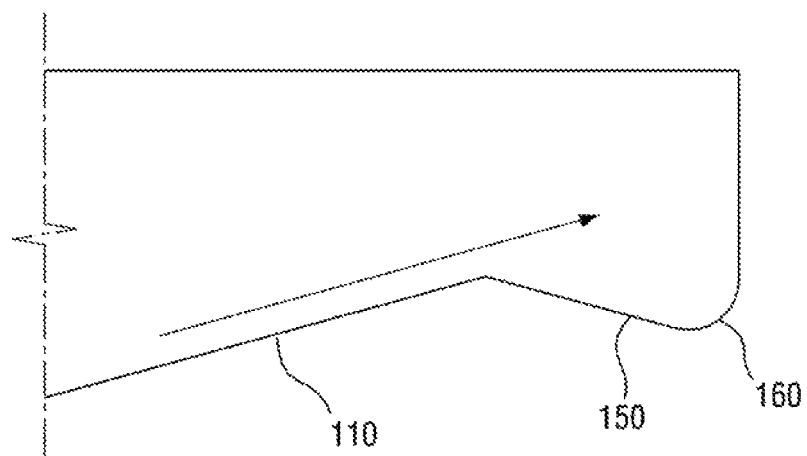

By forming $\theta_1$ that is larger than $\theta_2$, the round corner surface 160 is not positioned on the path of the light that is incident from the light source 10 to the inside of the lens structure 100, and thus the whirling can be prevented from occurring. Further, as illustrated in FIG. 11, the second inclined surface 150 may have an inclination that is opposite to the inclination of the first inclined surface 110.

Although not illustrated in the drawing, the projecting column 40 on the lens structure 101 as described above may be formed on the second inclined surface 150. If the projecting column 40 is formed on the second inclined surface 150, the light that is generated from the light source 10 can be prevented from traveling to the projecting column 40.

Figure 12:
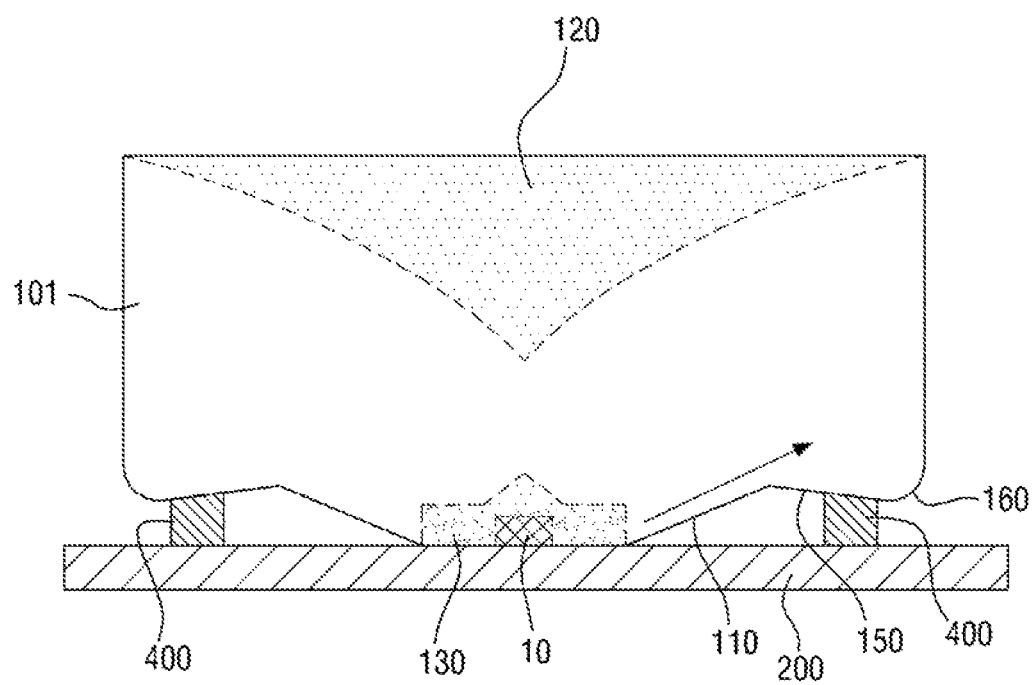
FIG. 12 is a cross-sectional view of an LED light source package according to still another embodiment.

FIG. 12 is a cross-sectional view of an LED light source package according to still another embodiment. Referring to FIG. 12, a plurality of lens legs 400 may be further provided to join the lens structure 101 and the circuit board 200 together, and the plurality of lens legs 400 may be formed on the second inclined surface 150. Further, although not illustrated in the drawing, projecting columns that project toward the circuit board may be further provided on the second inclined surface 150, and the projecting columns may be formed on the second inclined surface 150.

FIG. 13, FIG. 14, FIG. 15, FIG. 16, FIG. 17 and FIG. 18 are cross-sectional views of an LED light source package according to still another embodiment.

Figure 16:
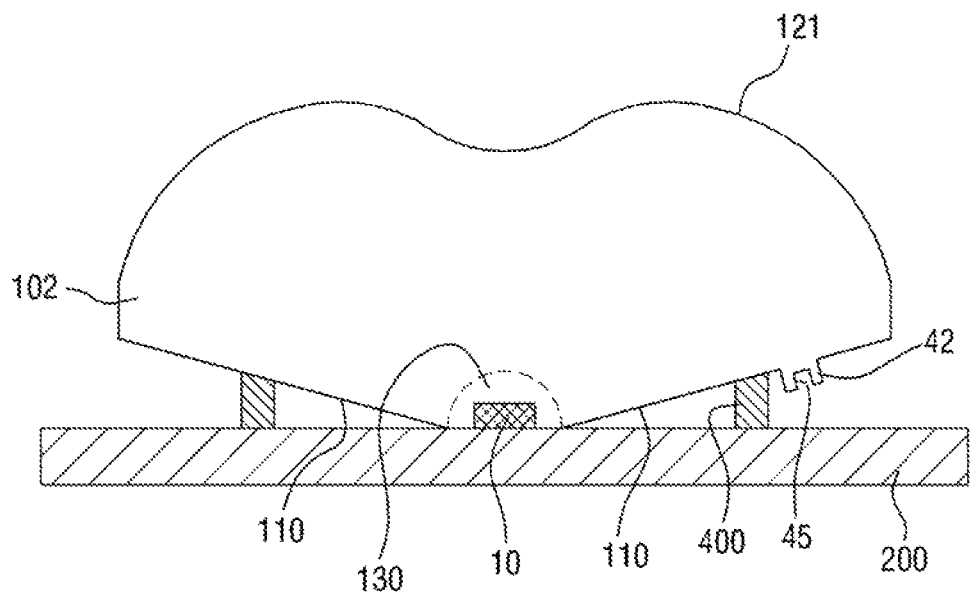
Figure 17:
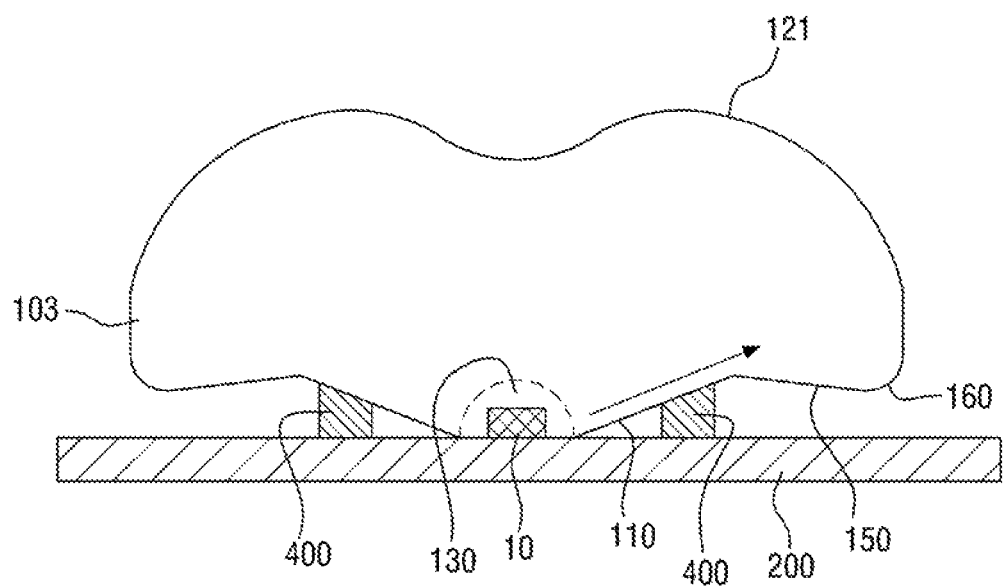
Figure 18:
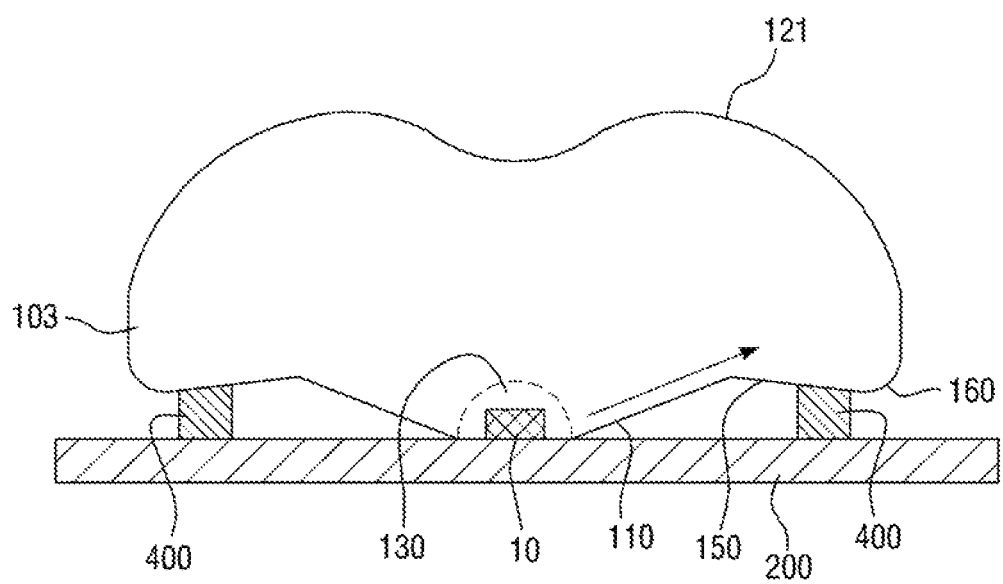

Hereinafter, referring to FIG. 13, FIG. 14, FIG. 15. FIG. 16, FIG. 17 and FIG. 18, various embodiments will be described.

Figure 13:
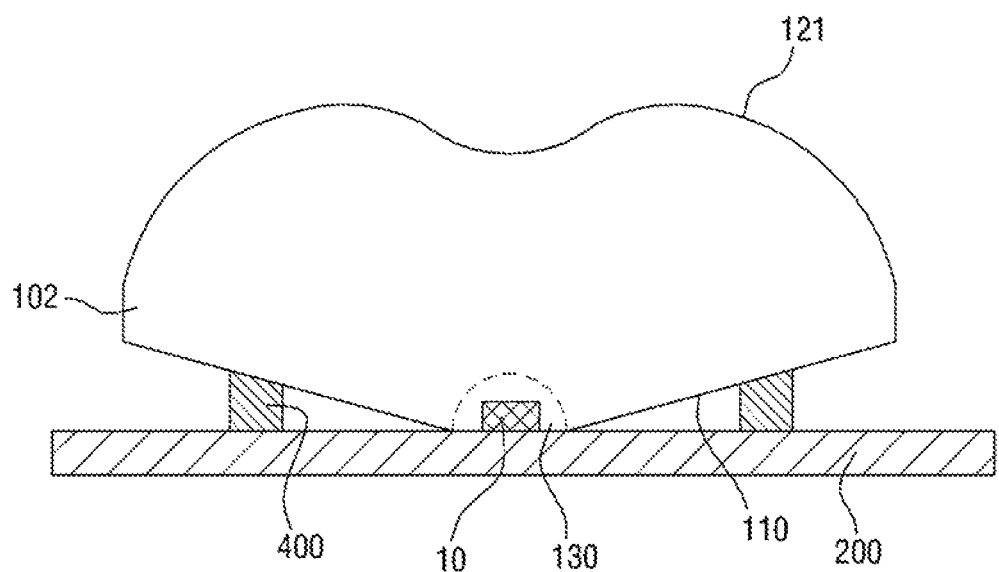
FIG. 13, FIG. 14, FIG. 15, FIG. 16, FIG. 17 and FIG. 18 are cross-sectional views of an LED light source package according to still another embodiment.

Referring to FIG. 13, the LED light source package may be of a top emitting type in which the center portion of an upper end portion 121 of the lens structure 102 is concave and the upper end portion 121 becomes convex as going toward the outer portion of the lens structure 102. The shape of the upper end portion 121 of the lens structure 100 may be appropriately modified by those having ordinary skill in the art to which the inventive concept pertains.

Figure 14:
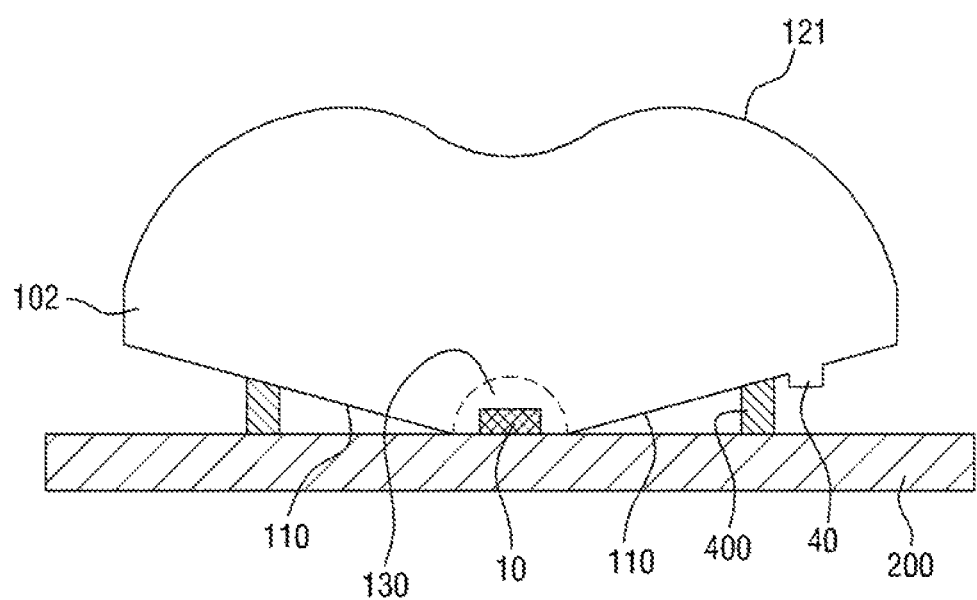

Referring to FIG. 14, unlike the LED light source package of FIG. 13, the LED light source package further includes a projecting column 40. Specifically, the projecting column 40 may be formed on one side surface of the lower end portion of the lens structure, e.g., on the first inclined surface 110, and may be formed on the outer portion based on the lens leg 400, e.g., outside of the lens leg 400.

Figure 15:
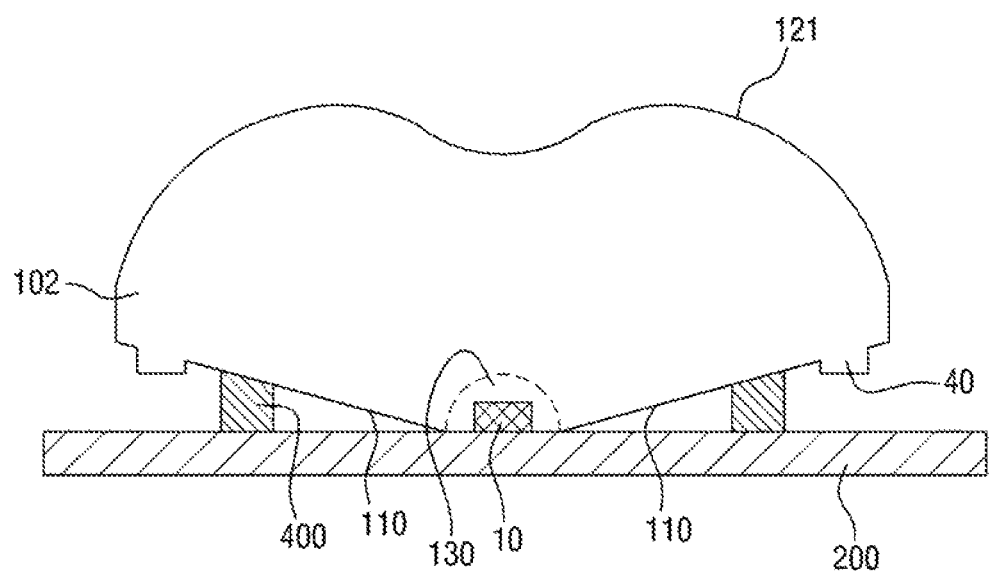

Referring to FIG. 15, unlike the LED light source package of FIG. 14, the LED light source package includes projecting columns 40 that are formed on both side surfaces of the lower end portion of the lens structure 102 e.g., on the first inclined surface 110. Specifically, the projecting columns 40 may be formed on the outer portion of the lower end portion of the lens structure 102, and may be formed on both side surfaces of the outer portion based on the lens legs 400.

Since the projecting columns 40 have been described, the detailed explanation thereof will be omitted.

Referring to FIG. 16, unlike the LED light source package of FIG. 14, the LED light source package further includes an intaglio groove 45 formed on the projecting column 42. Since the intaglio groove 45 has been described, the detailed explanation thereof will be omitted.

Referring to FIG. 17, unlike the LED light source package of FIG. 13, the LED light source package further includes a second inclined surface 150. Specifically, the second inclined surface 150 may be formed adjacent to the first inclined surface 110, and the lens legs 400 may be formed on the first inclined surface 110.

Referring to FIG. 18, unlike the LED light source package of FIG. 17, the LED light source package includes lens legs 400 formed on the second inclined surface 150.

Meanwhile, since the case where the LED light source package further includes the second inclined surface 150 and the case where the LED light source package includes the lens legs 400 formed on the second inclined surface 150 have been described, the detailed explanation thereof will be omitted.

The lens structure may be made of a transparent material, but is not specially limited thereto. For example, as the material of the lens structure, resin, plastic, or glass may be used. As the resin, for example, urethane acrylate, epoxy-acrylate, ester-acrylate, and radical generation type monomer may be used singly or mixedly. As the plastic, for example, at least one selected from the group including polymethylmethacrylate (PMMA), polycarbonate (PC), polystyrene (PS), polyethylene terephtalate (PET), and copolymer of PMMA and PS may be used. As the glass, silica or silicate series, in which oxide, such as lithium oxide ($Li_2O$), boron oxide ($B_2O_3$), calcium oxide (CaO), kalium (potassium) oxide ($K_2O$), or magnesium oxide (MgO), is added to silicon oxide ($SiO_2$), may be used.

Meanwhile, the lens leg may be made of the same material as the lens structure. Further, the lens leg may be adhered to the circuit board by adhesives, and the adhesives may be adhesives that are typically used in the art. Since the adhesives are well known in the art, the detailed explanation thereof will be omitted.

Meanwhile, still another embodiment may include a lens structure manufacturing apparatus for manufacturing the lens structure. The lens structure manufacturing apparatus may include a lens mold, an ejector pin hole formed on the lens mold, and an ejector pin formed in the ejector pin hole to extract the lens structure from the lens mold. Further, the intaglio shape of the lens mold may include the intaglio shape that corresponds to the shape of the lens structure as described above.

That is, the intaglio shape may include a corresponding shape so that the lens structure includes the first inclined surface to make the center portion of the lower end portion of the lens structure project to an outside further than the edge portion thereof. Further, the lens structure manufacturing apparatus may include an ejector pin for ejecting the formed lens structure and an ejector pin hole for enabling the ejector pin to perform upward/downward movement to extract the lens structure.

Further, the lens structure manufacturing, apparatus may further include an intaglio column formed on the upper portion of the ejector pin hole of the mold to form the projecting column on the lower end portion of the lens structure. As described above, in order to form the projecting column in the lens structure, it is necessary to form in advance an embossed column on the lens structure in the portion where the lens structure is pushed by the ejector pin. By forming the intaglio column on the upper portion of the ejector pin hole, the material of the lens structure flows into the intaglio column of the mold, and the projecting column can be formed on the lens structure when the lens structure is extracted.

A lens structure manufacturing method according to the inventive concept will be described. Polymer resin flows into the mold having a desired intaglio formed thereon, curing is performed using UV rays or heat, and then the lens structure is extracted through the ejector pin. Further, a glass or plastic melt solution is injected into the mold having a desired intaglio formed thereon, cooling is performed, and then the lens structure is extracted through the ejector pin hole.

Meanwhile, according to the inventive concept, a liquid crystal display that includes the LED light source package as described above may be provided, and the liquid crystal display may include a backlight unit including the LED light source package, an optical sheet, and an image display unit. The optical sheet may include a lenticular sheet for luminance improvement, a prism sheet, a micro lens array sheet, a diffusion sheet, and a reflection sheet. According to circumstances, two or more optical sheets may be used or arrangement thereof may be changed. Further, the image display unit may change the optical axis of light to pass the light as the voltage is applied thereto in a state where liquid crystals are interposed between two substrates, and may include configurations well known in the art, such as a polarizing plate and a color filter. Since the configuration of the liquid crystal display is well known in the art, the detailed explanation thereof will be omitted.

However, the effects of the inventive concept are not restricted to the one set forth herein. The above and other effects of the inventive concept will become more apparent to one of daily skill in the art to which the inventive concept pertains by referencing the claims.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims. The exemplary embodiments should be considered in a descriptive sense only and not for purposes of limitation.

What is claimed is:

1. An LED light source package comprising:
a circuit board;
a light source mounted on the circuit board;
a lens structure arranged on an upper portion of the circuit board via the light source, and
a plurality of lens legs to join the lens structure and the circuit board together,
wherein the plurality of lens legs are on an outer portion of the surface that is adjacent to the circuit board of the lens structure,
wherein a gap measured from the circuit board to a surface that is adjacent to the circuit board of the lens structure becomes larger as going far apart from the light source, and
wherein the lens structure further comprises a projecting column that projects toward the circuit board.

2. The LED light source package of claim 1, wherein the projecting column is on the surface that is adjacent to the circuit board.

3. An LED light source package comprising:
a circuit board;
a light source seated on an upper portion of the circuit board;
a lens structure arranged on the upper portion of the circuit board via the light source, wherein a surface that faces the light source in the lens structure includes a first inclined surface that projects toward the light source as going to a center portion of the lens structure, wherein the lens structure further comprises a second inclined surface having an inclination angle that is different from an inclination angle of the first inclined surface; and
a plurality of lens legs to join the lens structure and the circuit board together, wherein the plurality of lens legs are on the second inclined surface.

4. The LED light source package of claim 3, wherein the lens structure further comprises a projecting column that projects toward the circuit board, and the projecting column is on the second inclined surface.

* * * * *